US012009307B2

(12) United States Patent
Shan et al.

(10) Patent No.: US 12,009,307 B2
(45) Date of Patent: Jun. 11, 2024

(54) MULTI-DIE FPGA IMPLEMENTING BUILT-IN ANALOG CIRCUIT USING ACTIVE SILICON CONNECTION LAYER

(71) Applicant: WUXI ESIONTECH CO., LTD., Jiangsu (CN)

(72) Inventors: Yueer Shan, Wuxi (CN); Yanfeng Xu, Wuxi (CN); Jicong Fan, Wuxi (CN); Yanfei Zhang, Wuxi (CN); Hua Yan, Wuxi (CN)

(73) Assignee: WUXI ESIONTECH CO., LTD., Jiangsu (CN)

( * ) Notice: Subject to any disclaimer, the term of this patent is extended or adjusted under 35 U.S.C. 154(b) by 421 days.

(21) Appl. No.: 17/421,460

(22) PCT Filed: Dec. 30, 2020

(86) PCT No.: PCT/CN2020/141168
§ 371 (c)(1),
(2) Date: Jul. 8, 2021

(87) PCT Pub. No.: WO2022/001062
PCT Pub. Date: Jan. 6, 2022

(65) Prior Publication Data
US 2022/0344268 A1   Oct. 27, 2022

(30) Foreign Application Priority Data

Jul. 1, 2020   (CN) ......................... 202010622764.X

(51) Int. Cl.
*H01L 23/00* (2006.01)
*H01L 23/538* (2006.01)
(Continued)

(52) U.S. Cl.
CPC ...... *H01L 23/5381* (2013.01); *H01L 23/5386* (2013.01); *H01L 24/16* (2013.01);
(Continued)

(58) Field of Classification Search
None
See application file for complete search history.

(56) References Cited

U.S. PATENT DOCUMENTS 8,546,955 B1 * 10/2013 Wu ..................... H01L 23/5384
257/723
9,106,229 B1 * 8/2015 Hutton ................. H01L 25/105
(Continued)

FOREIGN PATENT DOCUMENTS

| CN | 101582412 | 11/2009 |
| CN | 102446883 | 5/2012 |

(Continued)

OTHER PUBLICATIONS

Su, H. et al., "Design of High Dynamic Range Display System with Wide Color Gamut," Journal of Tianjin University (Science and Technology), vol. 51, No. 6, Jun. 2018, pp. 651-657 (with English abstract).
(Continued)

*Primary Examiner* — Anh Q Tran
(74) *Attorney, Agent, or Firm* — HSML P.C.

(57) ABSTRACT

The present application discloses a multi-die FPGA implementing a built-in analog circuit using an active silicon connection layer, and relates to the field of FPGA technology. The multi-die FPGA allows multiple small-scale and small-area dies to cascade to achieve large-scale and large-area FPGA products, reducing processing difficulties and improving chip production yields. Meanwhile, due to the existence of the active silicon connection layer, some circuit structures that are difficult to implement within the die and/or occupy a large die area and/or have a low processing requirement can be laid out in the silicon connection layer, solving the existing problems of making these circuit structures directly within the die. Part of the circuit structures can be implemented within the silicon connection layer and the
(Continued)

rest in the die, which helps optimize the performance of FPGA products, improve system stability, and reduce system area.

17 Claims, 3 Drawing Sheets

(51) Int. Cl.
 H01L 25/065 (2023.01)
 H03K 19/17728 (2020.01)
 H03K 19/17736 (2020.01)
 H03K 19/1776 (2020.01)
 H03K 19/17764 (2020.01)
 H03K 19/17796 (2020.01)

(52) U.S. Cl.
 CPC ... *H01L 25/0652* (2013.01); *H03K 19/17728* (2013.01); *H03K 19/17744* (2013.01); *H03K 19/1776* (2013.01); *H03K 19/17764* (2013.01); *H03K 19/17796* (2013.01); *H01L 2224/16145* (2013.01); *H01L 2224/16227* (2013.01); *H01L 2224/16238* (2013.01); *H01L 2924/14211* (2013.01); *H01L 2924/1424* (2013.01); *H01L 2924/1431* (2013.01); *H01L 2924/14335* (2013.01); *H01L 2924/30105* (2013.01); *H01L 2924/30107* (2013.01); *H01L 2924/37001* (2013.01)

(56) References Cited

U.S. PATENT DOCUMENTS

| | | |
|---|---|---|
| 2010/0148316 A1 | 6/2010 | Kim et al. |
| 2012/0147567 A1 | 6/2012 | Lee et al. |
| 2013/0295727 A1* | 11/2013 | Hsu ................. H01L 23/5382 |
| | | 438/130 |
| 2015/0109024 A1 | 4/2015 | Abdelfattah et al. |
| 2016/0358889 A1 | 12/2016 | Lai et al. |
| 2019/0131976 A1* | 5/2019 | Chandrasekar ..... H01L 23/5385 |

FOREIGN PATENT DOCUMENTS

| | | |
|---|---|---|
| CN | 103681618 | 3/2014 |
| CN | 104064556 | 9/2014 |
| CN | 104685481 | 6/2015 |
| CN | 108352378 | 7/2018 |
| CN | 109564914 | 4/2019 |
| CN | 110010510 | 7/2019 |
| CN | 110739135 | 1/2020 |
| CN | 111753478 | 10/2020 |

OTHER PUBLICATIONS

First Office Action issued for Chinese Patent Application No. 202010622764.X, dated Nov. 18, 2021, 14 pages including partial English translation.

* cited by examiner

MULTI-DIE FPGA IMPLEMENTING BUILT-IN ANALOG CIRCUIT USING ACTIVE SILICON CONNECTION LAYER

This application is a national stage of International Application No. PCT/CN2020/141168, filed on Dec. 30, 2020, which claims priority to Chinese Patent Application No. 202010622764.X, filed on Jul. 1, 2020. Both of the aforementioned applications are hereby incorporated by reference in their entireties.

TECHNICAL FIELD

The present disclosure relates to the field of FPGA technology, in particular, to a multi-die FPGA with a built-in analog circuit using an active silicon connection layer.

BACKGROUND

FPGA (Field Programmable Gate Array) is a hardware programmable logic device widely used in mobile communication, data center, navigation guidance and autonomous driving. With the increasing demand for bandwidth, storage and data processing capabilities in new applications, the scale of FPGAs is increasing, and the requirements for functionality and stability are becoming higher and higher. However, the increase of FPGA size means the chip area increases, and the increase of area will lead to the increase of chip processing difficulty and the decrease of chip production yield. In order to achieve better functionality and stability, FPGAs often need to work with corresponding analog circuits. But it is difficult to make these analog circuits directly on FPGA chips, and even if they can be made, they will take up a lot of valuable chip area and cause other problems, for example, although the difficulty of making a resistor in FPGA chip is less, the resistor will occupy more chip area and cause chip thermal loss, chip temperature increase or uneven distribution, so these analog circuits are often used as peripheral circuits of FPGA, which will lead to complex system structure and low integration.

SUMMARY

One aspect of the disclosure provides a multi-die FPGA implementing a built-in analog circuit using an active silicon connection layer is provided. The multi-die FPGA comprises a substrate, a silicon connection layer laminated on the substrate and a plurality of FPGA dies laminated on the silicon connection layer, the silicon connection layer covers all of the FPGA dies. Each FPGA die comprises a plurality of configurable functional modules, interconnection resource modules arranged around each of the configurable functional modules and connection point leads, the configurable functional modules within the FPGA die comprise at least a programmable logic block, a silicon stacked connection module and an input and output block, the silicon stacked connection module comprises a plurality of silicon stacked connection points, the programmable logic block within the FPGA die is connected to the silicon stack connection point and the input and output block respectively through the interconnection resource modules, the silicon stack connection points are connected to the corresponding connection point leads through top metal wires within a re-distribution layer. The connection point leads within each FPGA die are connected to the corresponding connection point leads in other FPGA dies through cross-die wires within the silicon connection layer, each FPGA die can be connected to any of the other FPGA dies through the cross-die wires within the silicon connection layer. The input and output block within the FPGA die is connected to the substrate through a silicon via within the silicon connection layer. A first circuit structure is formed within the FPGA die, a port of the first circuit structure is connected to the corresponding silicon stack connection point via the interconnection resource module and then connected to the corresponding connection point lead through the top metal wire within the re-distribution layer. A second circuit structure is laid out within the silicon connection layer, the second circuit structure comprises a plurality of analog circuit elements, the connection point leads within the FPGA die connected to the port of the first circuit structure is connected to a port of the second circuit structure through silicon connection layer wires within the silicon connection layer, the first circuit structure and the second circuit structure are connected to form a built-in analog circuit within the multi-die FPGA, the input and output block within the silicon connection layer is also connected to the substrate.

Another aspect of the disclosure provides a multi-die FPGA, which includes a first die including a first circuit therewithin and a silicon connection layer on which the first die is laminated. The silicon connection layer includes a second circuit therewithin, and the second circuit includes at least one analog element. The first circuit and the second circuit are connected to collectively form a build-in analog circuit within the multi-die FPGA.

DETAILED DESCRIPTION OF THE EMBODIMENTS

Specific embodiments of the present disclosure are further described below in conjunction with the accompanying drawings.

Figure 1:
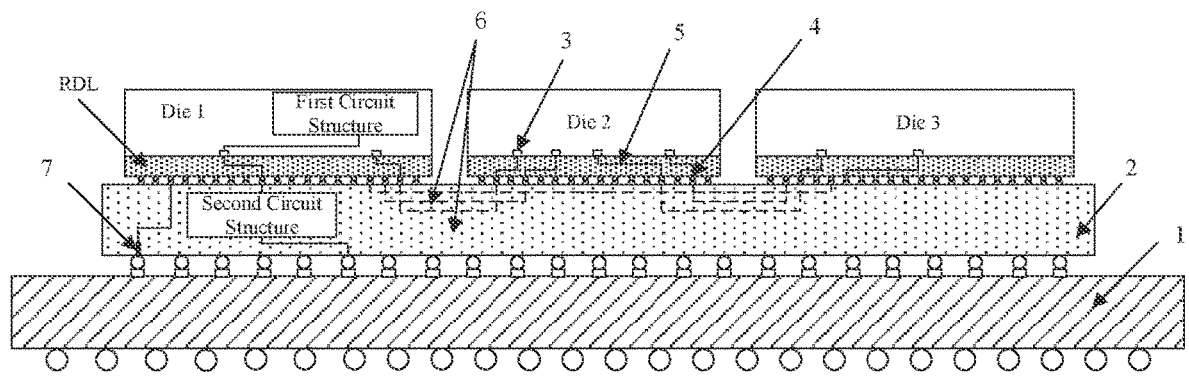
FIG. 1 is a cross-sectional view of the structure of the multi-die FPGA of the present application.

The present application discloses a multi-die FPGA implementing a built-in analog circuit using an active silicon connection layer. Referring to FIG. 1, the multi-die FPGA includes, in order of lamination from the bottom to the top, a substrate 1, a silicon connection layer 2 and a plurality of FPGA dies denoted by die 1, die 2, etc., respectively. In practical implementation, the FPGA also includes a package housing encapsulated outside the substrate 1, silicon connection layer 2 and FPGA die for protecting each component, and also includes pins connected to the substrate for signal pinout, etc. These conventional structures are not shown in detail in FIG. 1.

Figure 2:
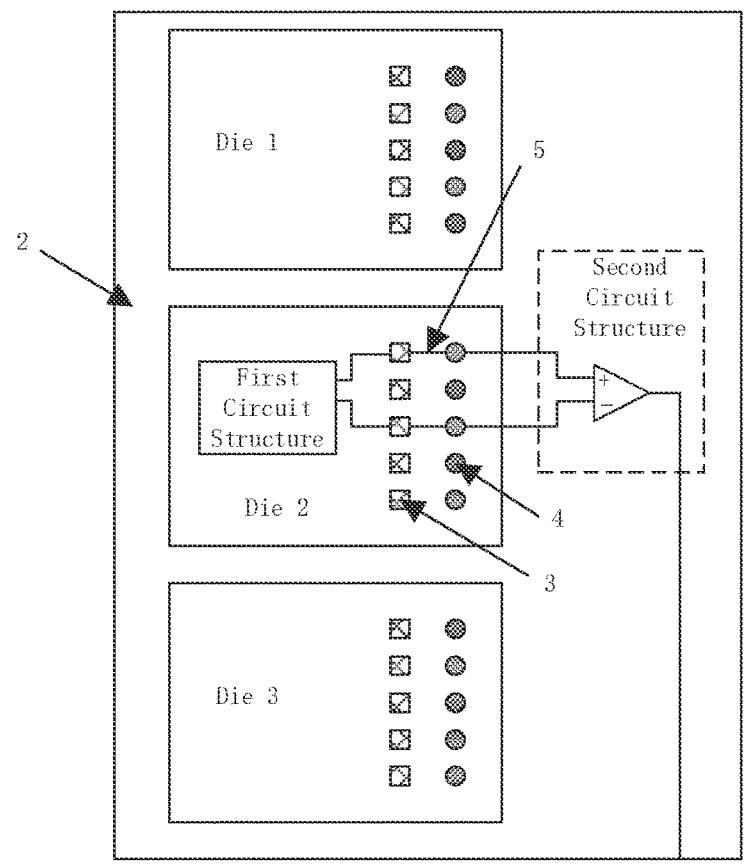
FIG. 2 is a schematic diagram of an internal circuit structure of the multi-die FPGA of the present application.
Figure 3:
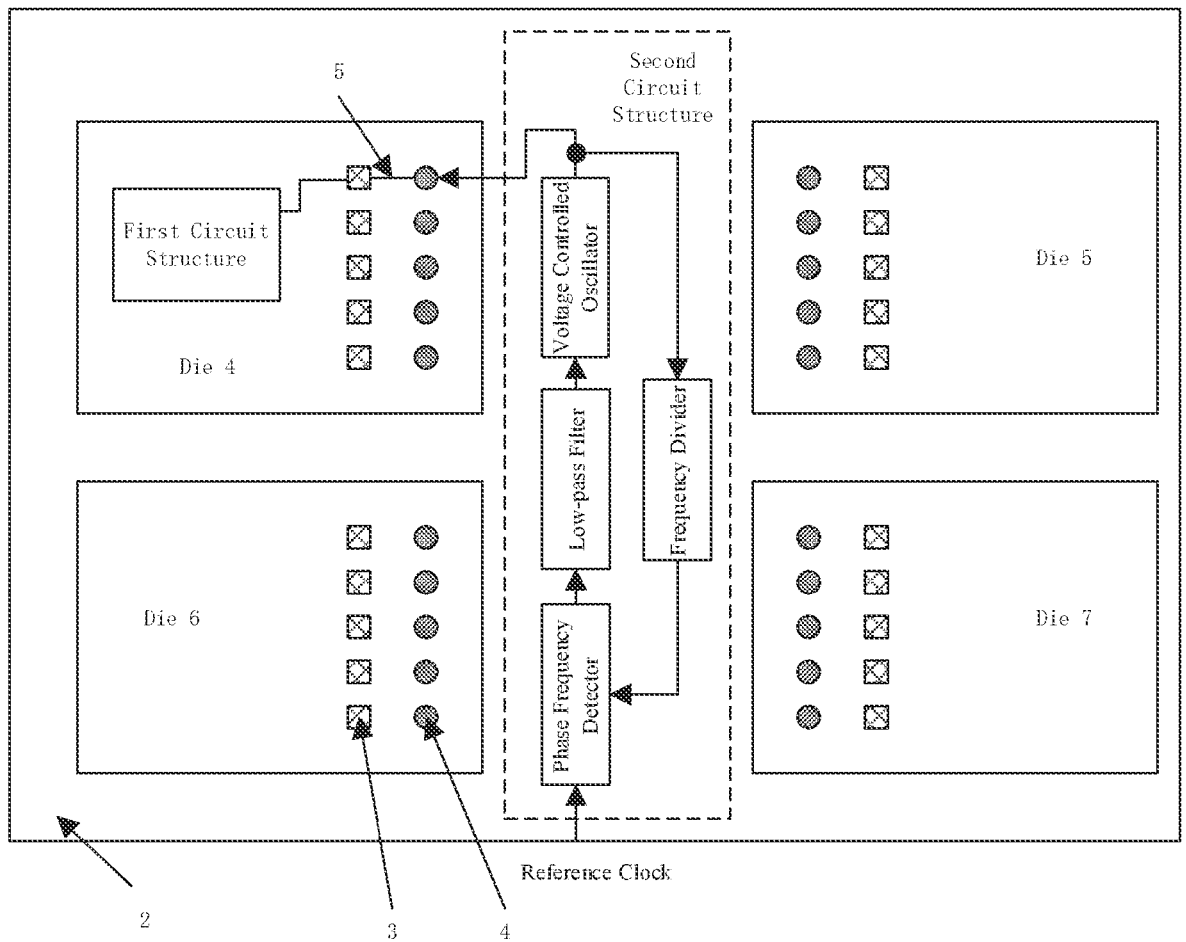
FIG. 3 is a schematic diagram of another internal circuit structure of the multi-die FPGA of the present application.

The FPGA of the present application does not use a single FPGA die structure, but includes a plurality of FPGA dies, which are laminated on the same silicon connection layer 2. These multiple FPGA dies can be arranged in a onedimensional direction on the silicon connectivity layer 2, as shown in the top view in FIG. 2, and can also be arranged on the silicon connection layer 2 in a two-dimensional stacking manner, i.e., along the horizontal and vertical directions in the horizontal plane, as shown in FIG. 3. The multiple FPGA dies can be reasonably arranged on the silicon connection layer 2, and the compact arrangement on the silicon connection layer 2 according to the shape and area of each FPGA die makes the overall area of the FPGA smaller and the interconnection performance between the dies better.

The internal structure of the FPGA die and the connection between the FPGA die and the silicon connection layer 2 are adjusted and carefully designed in the present application. The specific connection structure between the FPGA die and the silicon connection layer 2 and the implementation will be described below.

The FPGA die in the present application is different from a conventional FPGA die including configurable function modules with a variety of functions. The common configurable function modules mainly include programmable logic blocks (CLBs or PLBs) and input and output ports (IOBs), and sometimes some other function modules, such as BRAM, DSP, PC, etc. Each configurable function module has an interconnection resource module (INT) with the same structure arranged around the configurable function module, and the horizontal or vertical connecting wires between each configurable function module are connected through the INT module. The FPGA die in the present application, based on the conventional structure, includes not only the CLB, IOB and other functional modules which are conventional configurable functional modules, but also includes a silicon stacking connection module specifically designed within the die for inter-die signal interconnection needs. Each silicon stacking connection module includes a plurality of silicon stacking connection points 3. The silicon stacking connection module is a new configurable functional module specifically for die signal pinout. The FPGA die in the present application replaces certain conventional configurable function modules in the conventional FPGA die with silicon stack connection modules, and the conventional configurable function modules at any location can be replaced according to the signal interconnection requirements. For example, for the existing conventional Column-Based FPGA architecture, the silicon stacking connection module can be put in the row and column structure where the programmable logic block is located, or put in the row and column structure where other functional modules are located to obtain the FPGA die of the present application.

Each silicon stack connection module within the FPGA die in the present application also has an interconnect resource module arranged around the silicon stack connection module, so the winding structure of the FPGA die in the present application can remain the same as that of the conventional FPGA die without any change. The horizontal or vertical connections between the silicon stack connection module and each of other configurable function modules is connected via the INT module, and the silicon stack connection module LNK is directly connected to the interconnection switch in its corresponding interconnect resource module INT as part of an interconnection wire. The silicon stack connection module LNK and the interconnection switch can be fully or partially interconnected depending on the connectivity requirements.

The FPGA die in the present application also includes connection point leads 4 corresponding to the internal silicon stack connection points 3. The silicon stack connection point 3 within the FPGA die is connected to the corresponding connection point lead 4 through a top metal wire 5 within a re-distribution layer (RDL layer). It should be noted that FIG. 2 and FIG. 3 show the silicon stack connection points 3 and the connection point leads 4 in the same plane in order to illustrate the connection between the two. However, referring to FIG. 1, the silicon stack connection points 3 and the connection point leads 4 are actually in different planes. The connection point leads 4 are usually arranged in a row and column structure along a first direction and a second direction as needed for stacked interconnection. Alternatively, multiple rows/multiple columns of connection point leads 4 can be laid out for higher connectivity bandwidth, i.e., each FPGA die has a plurality of rows of connection point leads 4 along the first direction and/or a plurality of columns of connection point leads 4 along the second direction, thus enabling efficient two-dimensional cascading with multiple rows and columns. The multi-row/multi-column connection point leads 4 can be evenly spaced or randomly laid out along each direction.

The FPGA die in the present application has a first circuit structure formed within it, which can be an analog circuit, a digital circuit, or an analog-digital hybrid circuit, etc. The first circuit structure can be formed based on the programmable logic block within the FPGA die, and the programmable logic block for forming the first circuit structure includes at least one of CLB, BRAM, and DSP. Further, the programmable logic block used to build the first circuit structure may be dynamically configured by a dynamically programmable port of the FPGA die within which they are located.

The port of the first circuit structure is also connected to the corresponding silicon stack connection points 3 through the interconnect resource module and then to the corresponding connection point leads 4 through the top metal wires 5 within the re-distribution layer. FIG. 1 illustrates only the first circuit structure within die 1. The same or different first circuit structures can exist within multiple FPGA dies.

The cross-die wires 6 are laid with the silicon connection layer 2, and the connection point leads 4 of the FPGA die connected to the programmable logic block can be connected to the corresponding connection point leads 4 of other FPGA dies through the cross-die wires 6 within the silicon connection layer 2 to realize the interconnection between FPGA dies. Since the cross-die wires 6 are arranged in layers, the span and direction of the wires are flexible, so each FPGA die can be connected to any other FPGA die through the cross-die wires 6 within the silicon connection layer 2. For example, as shown in FIG. 2, die 1 can be connected to the adjacent die 2 or to the spaced die 3. In FIG. 3, for example, die 4 can be connected to die 5 in the same row, or to die 6 in the same column, or to die 7 in a different row and in a different column. The way that the connection point leads 4 are connected to the silicon connection layer 2 may be as follows: small balls are provided on the FPGA die, and the connection point leads 4 are connected to the silicon connection layer 2 through the small balls and connected to other FPGA dies through the cross-die wires 6 within the silicon connection layer 2. FIG. 1 shows the structure of the small balls on the bottom of the FPGA die, which is not denoted in detail in the present application. The input and output ports within the FPGA die are connected to the substrate 1 through silicon vias 7 on the silicon connection layer 2.

In the present application, the silicon connection layer 2 is an active silicon connection layer, and besides the cross-die wires 6, the silicon connection layer 2 further includes a second circuit structure which is an analog circuit and includes a plurality of analog circuit elements. The input and output ports of the silicon connection layer 2 are also connected to the substrate 1. The second circuit structure can be implemented as a variety of circuit structures, mainly in the following three types:

1. The second circuit structure is a circuit structure that is not easily implemented within the FPGA die. Due to the chip area and processing difficulties, certain analog circuit elements within the FPGA die often only achieve a small circuit parameter specification, while the present application can lay these analog circuit elements with limited circuit parameter specifications on the silicon connection layer 2 to achieve larger circuit parameter specifications, so the circuit parameter specification of the second circuit structure on the silicon connection layer 2 are larger than a predetermined parameter specification which is the maximum circuit parameter specifications that can be achieved in the FPGA die for the same circuit structure. The main analog circuit elements in this type are capacitors and inductors.

Figure 4:
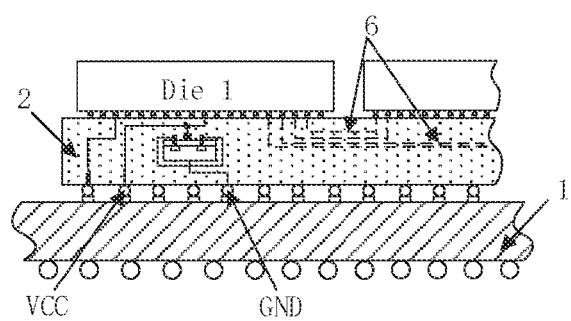
FIG. 4 is a schematic diagram of another partial structure of the multi-die FPGA of the present application in cross-section.

When it is a capacitor, which can be implemented by NMOS transistors, the second circuit structure includes a capacitor with a capacitance greater than a predetermined parameter specification for the capacitance, which is the maximum capacitance achievable within the FPGA die. The capacitors in the conventional FPGA die usually only reach the pF-level, while the capacitors within the second circuit structure of the present application can have a uF-level or greater capacitance. For example, in a conventional application as shown in FIG. 4, connecting a capacitor at the power interface VCC and grounding it to GND can achieve the effect of power supply, noise reduction and filtering without the need for packaging external capacitors, so the package size is reduced.

Figure 5:
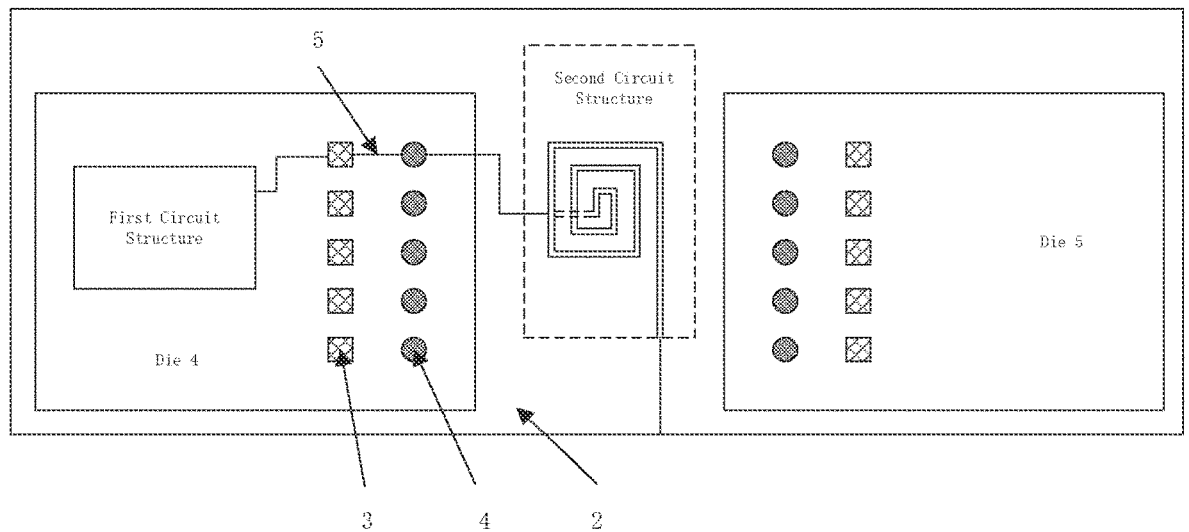
FIG. 5 is a schematic diagram of another internal circuit structure of the multi-die FPGA of the present application.

When it is an inductor device, it is implemented by a winding within the silicon connection layer 2, as shown in FIG. 5. The second circuit structure includes an inductor with inductance greater than a predetermined parameter specification for inductance, which is the maximum inductance achievable within the FPGA die. The inductance in the conventional FPGA die is usually only at the nH-level, while the inductance of the inductor in the second circuit structure of the present application can reach the level of 100 nH or more.

2. The second circuit structure is a circuit structure that is larger in scale and occupies a larger area, i.e., the circuit size of the second circuit structure is larger than a predetermined size which is a preset parameter. This type of second circuit structure includes at least one of resistor, bipolar transistor, operational amplifier, phase-locked loop, delayed phase-locked loop, oscillator, or RF acquisition circuit. This type of large-size circuit structure is laid out within the silicon connection layer, which can effectively reduce the area of the FPGA die and increase the digital logic scale.

For example, the second circuit structure can be a terminal matching resistor for LVDS.

For example, as shown in FIG. 3, the second circuit structure can be a phase-locked loop consisting of a phase frequency detector, low-pass filter, voltage controlled oscillator and frequency divider to form a phase-locked loop through which the reference clock is input to the FPGA die.

For example, the second circuit structure can be a RF acquisition circuit, which can quickly realize the FPGA product that support RF direct acquisition, making the FPGA product have the advantages of low power and high reliability.

3. The second circuit structure is a circuit structure with a lower processing requirement. The second circuit structure requires a lower process level than a predetermined process level which is a predetermined measure. The silicon connection layer and the FPGA die use different process techniques, and the process technique used for the FPGA die is better than that used for the silicon connection layer. Typically, the FPGA die uses the most advanced process technique to increase the scale of logic resources and system operating frequency, while the process technique for the silicon connection layer is lower, so the circuit structure with lower processing requirements can be laid out within the silicon connection layer to improve processing efficiency. The processing requirements of different components are well known in the industry, and the common second circuit structures with lower processing requirements can be specifically resistors, inductors, capacitors, etc., which are not described in detail in the present application.

The connection point lead 4 within the FPGA die connected to the port of the first circuit structure is connected to a port of the second circuit structure through the silicon connection layer wire within the silicon connection layer. The first circuit structure and the second circuit structure are connected to form an entire built-in analog circuit within the multi-die FPGA. It should be noted that the cross-die wires are connected between the FPGA dies, and the silicon connection layer wires are connected between the FPGA die and the second circuit structure. The application uses two different names in order to distinguish between the two connections, but the silicon connection layer wire as well as the cross-die wire are both metal wires, so the silicon connection layer wire is not denoted in the figures.

According to the different circuits of the first circuit structure and the second circuit structure, the built-in analog circuit within the multi-die FPGA can be summarized as follows. The built-in analog circuit within the multi-die FPGA mainly includes the analog part and the corresponding required digital part.

(1) The analog part of the built-in analog circuit is completely laid out within the silicon connection layer, i.e., the analog part is implemented by the second circuit structure only.

(2) The analog part of the built-in analog circuit is partly laid out within the silicon connection layer and partly laid out within the FPGA die, in which case the first circuit structure formed within at least one FPGA die of the multi-die FPGA is an analog circuit, and the second circuit structure within the silicon connection layer and the first circuit structure within at least one FPGA die collectively form the analog part.

Figure 6:
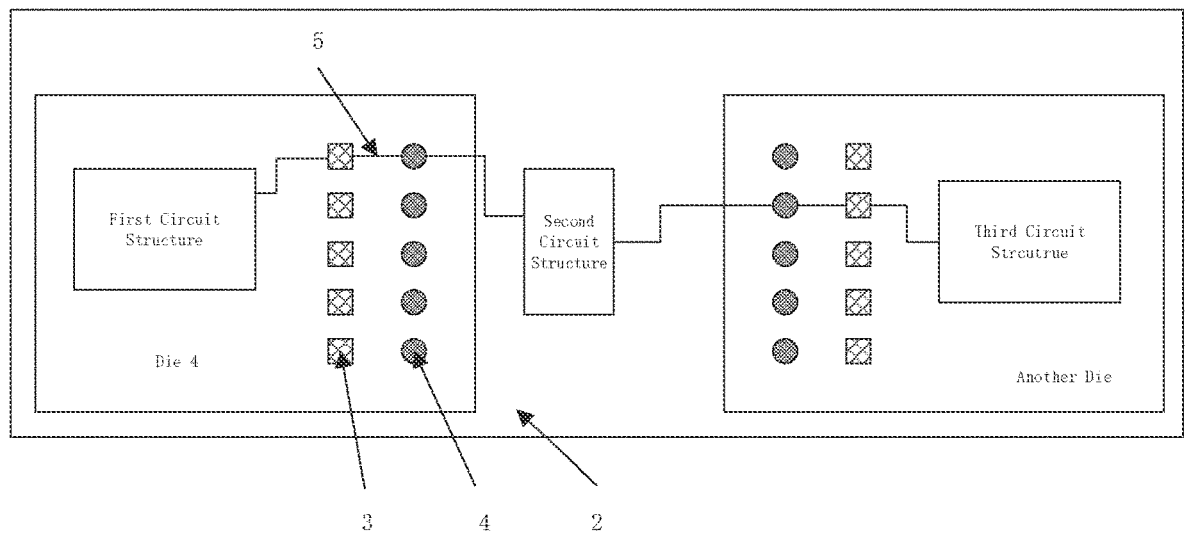
FIG. 6 is a schematic diagram of another internal circuit structure of the multi-die FPGA of the present application.

(3) The analog part of the built-in analog circuit is partly laid out within the silicon connection layer and partly laid out within another die. In this case, the multi-die FPGA also includes another die laminated on the silicon connection layer, and a third circuit structure of the analog circuit structure is formed within the another die. The structure of the another die is similar to the structure of the FPGA die in the present application, and all include silicon stacked connection modules. A port of the third circuit structure is connected to the corresponding silicon stack connection point, and then connected to the corresponding connection points lead through the top metal wire within the re-distribution layer, and to the port of the second circuit structure through the silicon connection layer wires within the silicon connection layer. The connection is in a similar manner as the first circuit structure being connected to the second circuit structure, and will not be repeated in the present application. Referring to the schematic structure in FIG. 6, in addition to the die 4 which is the FPGA die, the silicon connection layer 2 also includes other dies laid out therewithin. In this case, the third circuit structure is connected to the first circuit structure and the second circuit structure to form the built-in analog circuit within the multi-die FPGA. In this case, the second circuit structure within the silicon connection layer and the third circuit structure within the another die collectively form the analog part.

In this case, the multi-die FPGA includes one or more other dies therewithin, and the third circuit structures within each other die are interconnected through the silicon connection layer wires within the silicon connection layer to form a third circuit structure of a larger scale.

(4) The analog part of the built-in analog circuit is partly laid out within the silicon connection layer, partly laid out within another die, and partly laid out within the FPGA die. This case can be seen as a combination of the above cases (2) and (3), and is implemented in a similar manner, which is not repeated in the present application.

In the above four cases, the digital part of the built-in analog circuit is laid out within the silicon connection layer, or, the digital part is laid out within at least one FPGA die, or, the digital part is laid out within the silicon connection layer and at least one FPGA die. When the digital portion of the built-in analog circuit is laid out within at least one FPGA die, the first circuit structure formed within at least one FPGA die of the multi-die FPGA is a digital circuit. In particular, in the above cases (2), (3) and (4), since the analog part is also laid out within the FPGA die and the digital part is also laid out within the FPGA die, the first circuit structure formed within at least one FPGA die of the multi-die FPGA is an analog-digital hybrid circuit. The analog-digital hybrid circuit within the FPGA die, on one hand, formed an analog part together with the second circuit structure within the silicon connection layer, and on the other hand, form a digital part together.

Regardless of the specific circuit structure of the second circuit structure, any of the following signals may be transmitted between the port of the first circuit structure and the port of the second circuit structure: analog, digital, and differential signals.

When analog signals are transmitted between the port of the first circuit structure and the port of the second circuit structure, the port of the first circuit structure is connected directly to the port of the second circuit structure through the silicon connection layer wire, i.e., connected directly through a direct metal wire.

When digital signals are transmitted between the port of the first circuit structure and the port of the second circuit structure, a buffer BUF is provided on the silicon connection layer wire between the port of the first circuit structure and the port of the second circuit structure, and the BUF is usually also laid out within the silicon connection layer.

When a differential signal is transmitted between the port of the first circuit structure and the port of the second circuit structure, the port of the first circuit structure includes a first differential port and a second differential port, and the port of the second circuit structure also includes a first differential port and a second differential port, and the two first differential ports are connected in correspondence and the two second differential ports are connected in correspondence, and the signal wires between the two first differential ports and the signal wires between the two second differential ports are identical. The signal wires between the two differential port includes the segments of the differential port of the first circuit structure—the silicon stack connection point—the connection point lead—the differential port of the second circuit structure. Being identical indicates that they must match each other throughout the whole chain, and have the same wiring, shape, distance and interface.

Alternatively, the circuit parameters of the second circuit structure in the present application can be regulated and configured by a configuring circuit within the multi-die FPGA, which is a configuration chain within the FPGA die, or, a dynamically reconfigurable port within the FPGA die.

According to various embodiments of the present application, the multi-die FPGA integrates multiple FPGA dies using the silicon connection layer, which can cascade multiple small-scale and small-area FPGA dies to realize large-scale and large-area FPGA products, reduce processing difficulties, improve chip production yields, and accelerate design speed. In addition, due to the existence of the active silicon connection layer, some circuit structures that are difficult to implement within the die and/or will occupy a large die area and/or requires a low manufacturing process can be laid out within the silicon connection layer, solving the existing problems relating to the making of circuit structures directly on the die, allowing part of the circuit structures to be implemented in the silicon connection layer and the rest to be implemented within the FPGA die, and finally integrating the required circuit structures within the FPGA product by connecting the two parts through the connection wires within the silicon connection layer. It is conducive to optimizing the performance of FPGA products, improving system stability and reducing system area.

What is described above are only embodiments of the present application, and the present disclosure is not limited to the above embodiments. It is understood that other improvements and variations directly derived or associated by a person skilled in the art without departing from the spirit and conception of the present disclosure shall be considered to be included in the scope of protection of the present disclosure.

What is claimed is:

1. A multi-die FPGA implementing a built-in analog circuit using an active silicon connection layer, wherein the multi-die FPGA comprises a substrate, a silicon connection layer laminated on the substrate and a plurality of FPGA dies laminated on the silicon connection layer, the silicon connection layer covering all of the FPGA dies;

each FPGA die comprises a plurality of configurable functional modules, interconnection resource modules arranged around each of the configurable functional modules and connection point leads, the configurable functional modules within the FPGA die comprise at least a programmable logic block, a silicon stacked connection module and an input and output block, the silicon stacked connection module comprises a plurality of silicon stacked connection points, the programmable logic block within the FPGA die is connected to the silicon stack connection point and the input and output block respectively through the interconnection resource modules, the silicon stack connection points are connected to the corresponding connection point leads through top metal wires within a re-distribution layer; the connection point leads within each FPGA die are connected to the corresponding connection point leads in other FPGA dies through cross-die wires within the silicon connection layer, each FPGA die can be connected to any of the other FPGA dies through the cross-die wires within the silicon connection layer; the input and output block within the FPGA die is connected to the substrate through a silicon via within the silicon connection layer;

a first circuit structure is formed within the FPGA die, a port of the first circuit structure is connected to the corresponding silicon stack connection point via the interconnection resource module and then connected to the corresponding connection point lead through the top metal wire within the re-distribution layer;

a second circuit structure is laid out within the silicon connection layer, the second circuit structure comprises a plurality of analog circuit elements, the connection point leads within the FPGA die connected to the port of the first circuit structure is connected to a port of the second circuit structure through silicon connection layer wires within the silicon connection layer, the first circuit structure and the second circuit structure are connected to form a built-in analog circuit within the multi-die FPGA, the input and output block within the silicon connection layer is also connected to the substrate.

2. The multi-die FPGA according to claim 1, wherein a circuit parameter specification of the second circuit structure is higher than a predetermined parameter specification which is the maximum circuit parameter specification achievable within the FPGA die for the same circuit structure.

3. The multi-die FPGA according to claim 2, wherein the second circuit structure comprises a capacitor with a capacitance greater than a predetermined parameter specification for the capacitance which is the maximum capacitance achievable within the FPGA die, the capacitor having a uF-level or greater capacitance.

4. The multi-die FPGA according to claim 2, wherein the second circuit structure comprises an inductor implemented by a winding within the silicon connection layer, the inductor having an inductance greater than a predetermined inductance parameter specification which is the maximum inductance achievable within the FPGA die, the inductor having an 100 nH-level or greater inductance.

5. The multi-die FPGA according to claim 1, wherein the second circuit structure has a circuit size greater than a predetermined size.

6. The multi-die FPGA according to claim 5, wherein the second circuit structure comprises at least one of a resistor, a bipolar transistor, an operational amplifier, a phase-locked loop, a delayed phase-locked loop, an oscillator, or an RF acquisition circuit.

7. The multi-die FPGA according to claim 1, wherein the silicon connection layer and FPGA die use different process techniques, and the process technique used for the FPGA die is better than the process technique used for the silicon connection layer, the second circuit structure thus requiring a lower process level than a predetermined process level.

8. The multi-die FPGA according to claim 1, wherein when analog signals are transmitted between the port of the first circuit structure and the port of the second circuit structure, the port of the first circuit structure is connected directly to the port of the second circuit structure through the silicon connection layer wire.

9. The multi-die FPGA according to claim 1, wherein when digital signals are transmitted between the port of the first circuit structure and the port of the second circuit structure, a buffer is further provided on the silicon connection layer wire between the port of the first circuit structure and the port of the second circuit structure.

10. The multi-die FPGA according to claim 1, wherein when differential signals are transmitted between the port of the first circuit structure and the port of the second circuit structure, the port of the first circuit structure comprises a first differential port and a second differential port, and the port of the second circuit structure also comprises a first differential port and a second differential port, the two first differential ports being connected in correspondence, the two second differential block being connected in correspondence, a signal wire between the two first differential ports and a signal wire between the two second differential port are identical.

11. The multi-die FPGA according to claim 1, wherein the first circuit structure formed within at least one FPGA die of the multi-die FPGA is a digital circuit, and/or, the first circuit structure formed within at least one FPGA die is an analog circuit, and/or, the first circuit structure formed within at least one FPGA die is an analog-digital hybrid circuit.

12. The multi-die FPGA according to claim 1, wherein the multi-die FPGA further comprises another die laminated on the silicon connection layer, a third circuit structure with an analog circuit structure is formed within the another die, a port of the third circuit structure is connected to the corresponding silicon stack connection points and then connected to the corresponding connection point leads through the top metal wires within the re-distribution layer and to a port of the second circuit structure through the silicon connection layer wires within the silicon connection layer; the third circuit structure is connected to the first circuit structure and the second circuit structure to form the built-in analog circuit within the multi-die FPGA.

13. A multi-die FPGA according to claim 1, wherein a circuit parameter of the second circuit structure is regulated and configured by a configuring circuit within the multi-die FPGA.

14. The multi-die FPGA according to claim 13, wherein the configuring circuit within the multi-die FPGA is a configuration chain within the FPGA die.

15. The multi-die FPGA according to claim 13, wherein the configuring circuit within the multi-die FPGA is a dynamically reconfigurable port within the FPGA die.

16. The multi-die FPGA according to claim 1, wherein the first circuit structure is built based on a programmable logic block within the FPGA die, the programmable logic block building the first circuit structure comprising at least one of a CLB, a BRAM and a DSP.

17. The multi-die FPGA according to claim 16, wherein the programmable logic building the first circuit structure is dynamically configured by a dynamically programmable port of the FPGA die within which it is located.

* * * * *